United States Patent [19]
Suzuki et al.

[11] Patent Number: 6,034,905
[45] Date of Patent: Mar. 7, 2000

[54] APPARATUS FOR TESTING SEMICONDUCTOR MEMORY DEVICE

[75] Inventors: Kunihiko Suzuki, Tokyo-to; Kazuhiro Shibano, Yokohama, both of Japan

[73] Assignees: Kabushiki Kaisha Toshiba, Kawasaki; Asia Electronics Inc., Tokyo-To, both of Japan

[21] Appl. No.: 09/078,542

[22] Filed: May 14, 1998

[30] Foreign Application Priority Data

May 14, 1997 [JP] Japan ................................ 9-124010

[51] Int. Cl.⁷ ........................................ G11C 7/00
[52] U.S. Cl. .................. 365/201; 365/189.07; 365/191; 365/210
[58] Field of Search .................... 365/201, 200, 365/189.07, 191, 230.01, 210; 324/158.1

[56] References Cited

U.S. PATENT DOCUMENTS 5,666,049  9/1997  Yamada et al. .................. 324/158.1
5,706,234  1/1998  Pilch, Jr. et al. .................. 365/201

*Primary Examiner*—David Nelms
*Assistant Examiner*—Thong Le
*Attorney, Agent, or Firm*—Foley & Lardner

[57] ABSTRACT

A semiconductor memory testing apparatus of the present invention includes a signal generating unit for generating an input signal, an address signal and an expected value signal, a judging unit for judging a quality by comparing the output signal outputted by a semiconductor memory device under test with the expected value signal and generating a judgement signal, and a defect analyzing memory unit having a defect analyzing memory for storing the judgement signal. An address space of the address signal generated by the signal generating unit is set according to classification of the memory cells of the semiconductor memory device under test, and the signal generating unit includes an address space switching unit for switching over the address space as the necessity may arise. The defect analyzing memory unit sets a predetermined address in accordance with the address space to which the address signal belongs.

7 Claims, 9 Drawing Sheets

| | $Y_J$ | $X_I$ | $Y_D \sim Y_C$ | $X_B \sim X_A$ | ADDRESSES APPLIED TO MEMORY UNDER TEST |
|---|---|---|---|---|---|
| MEMORY CELL(A) | 0 | 0 | $Y_D \sim Y_C$ (10 BITS) | $X_B \sim X_A$ (10 BITS) | |
| MEMORY CELL(B) | 0 | 1 | $Y_{D'} \sim Y_{C'}$ (10 BITS) | $X_F \sim X_E$ (6 BITS) | $(F-E \leqq B-A, D'-C' \leqq D-C)$ |
| MEMORY CELL(C) | 1 | 0 | $Y_H \sim Y_G$ (6 BITS) | $X_{B'} \sim X_{A'}$ (10 BITS) | $(B'-A' \leqq B-A, H-G \leqq D-C)$ |
| MEMORY CELL(D) | 1 | 1 | $Y_H \sim Y_G$ (6 BITS) | $X_F \sim X_E$ (6 BITS) | $(F-E \leqq B-A, H-G \leqq D-C)$ |

ADDRESS PATTERNS FOR CONTROLLING SWITCHING OF MEMORY CELLS

ADDRESS PATTERNS FOR ACCESSING MEMORIES 0,1: FIXED ADDRESSES

ADDRESS SETTING FOR DEFECT ANALYZING MEMORY 0,1: FIXED ADDRESSES

| | | | | |
|---|---|---|---|---|
| MEMORY CELL(A) | 0 | $Y_D$ $\underbrace{\phantom{XXX}}$ $Y_C$ | $X_B$ $\underbrace{\phantom{XXX}}$ $X_A$ | |
| | | (10 BITS) | (10 BITS) | |
| MEMORY CELL(B) | 1 0000 | $Y_D$ $\underbrace{\phantom{XXX}}$ $Y_C$ | $X_B$ $\underbrace{\phantom{XXX}}$ $X_A$ | |
| | | (10 BITS) | (10 BITS) | |
| MEMORY CELL(C) | 1 0001 | $Y_{D'}$ $\underbrace{\phantom{XXX}}$ $Y_{C'}$ | $X_F$ $\underbrace{\phantom{XXX}}$ $X_E$ | |
| | | (10 BITS) | (6 BITS) | |
| MEMORY CELL(D) | 1 0001 0000 | $Y_H$ $\underbrace{\phantom{XXX}}$ $Y_G$ | $X'_B$ $\underbrace{\phantom{XXX}}$ $X'_A$ | |
| | | (6 BITS) | (10 BITS) | |
| | 1 | $Y_H$ $\underbrace{\phantom{XXX}}$ $Y_G$ | $X_F$ $\underbrace{\phantom{XXX}}$ $X_E$ | |
| | | (6 BITS) | (6 BITS) | |

APPARATUS FOR TESTING SEMICONDUCTOR MEMORY DEVICE

BACKGROUND OF THE INVENTION

The present invention relates generally to an apparatus for testing a semiconductor memory device and, more particularly, to a semiconductor memory testing apparatus for relieving a memory cell of a defective memory under test from a defect taking a defect in a redundant circuit into consideration.

FIG. 8 is a block diagram showing a construction of a prior art semiconductor memory testing apparatus.

Referring to FIG. 6, the semiconductor memory testing apparatus is constructed of a central control unit 61 for controlling an operation of the whole apparatus, a pattern generator 62 for generating patterns of a variety of signals, a waveform shaping unit 66 for shaping waveforms in accordance with the patterns of the variety of signals which are received from the pattern generator 62 and inputting the variety of signals to a memory 68 under test, a judging unit 69 for judging whether the memory 68 under test is good or defective by comparing an output data signal from the memory 68 under test with an expected value pattern given from the pattern generator 62, and a defect analyzing memory unit 60 for receiving and storing a judgement signal given from the judging unit 69. The memory 68 under test is a semiconductor memory device as a subject to be tested.

The pattern generator 62 includes an address generator 63 for generating an address pattern, a data generator 64 for generating an input data pattern and an expected value pattern, and a control signal generator 65 fox generating a control signal pattern. The waveform shaping unit 66 includes a pattern selecting unit 67 for selecting any one of the patterns of the variety of signals. The defect analyzing memory unit 60 includes an address setting unit 71 for converting an address pattern an address to be tested within the memory 68 under test into an address when the defect analyzing memory 72 is stored with the judgement signal in accordance with a structure of the memory 68 under test, and the defect analyzing memory 72 for storing the judgement signal transmitted from the judging unit 69.

Based on a test program, the central control unit 61 controls the pattern generator 62, the waveform shaping unit 66, the judging unit 69 and the defect analyzing memory unit 60 in accordance with the operation control signal via a bus line. The central control unit 61 also processes defect data (good "0", and defect: "1") in the defect analyzing memory unit 60, and writes data of "0"/"1" to the defect analyzing memory unit 60.

The address generator 63 of the pattern generator 62 generates an address pattern with respect to the memory 68 under test, and an address pattern with respect to the defect analyzing memory unit 60. The data generator 64 of the pattern generator 62 generates an input data pattern with respect to the memory 68 under test, and an expected value pattern with which the output data signal from the memory 68 under test is compared and contrasted. The control signal generator 65 of the pattern generator 62 generates a control signal pattern with respect to the memory 68 under test.

The waveform shaping unit 66 shapes the waveform in accordance with the patterns of the address signal, the input data signal and the control signal which are received from the pattern generator 62, and generates the input signals, i.e., the address signal, the input data signal and the control signal to the memory 68 under test. The pattern selecting unit 67 of the waveform shaping unit 66 is capable of selecting any one of the plurality of patterns serving as a basis of the input signals to the memory 68 under test.

The judging unit 69 compares the output data signal from the memory 68 under test with the expected value pattern from the pattern generator 62, thus judging whether the memory 68 under test is defective or not.

The address setting unit 71 of the defect analyzing memory unit 60 converts into an address when the defect analyzing memory 72 is stored with the judgement signal, an address pattern (an address pattern from the pattern generator 62) of an address of a memory cell area that is a test subject in the memory 68 under test, in accordance with the structure of the memory 68 under test. The defect analyzing memory 72 of the defect analyzing memory unit 60 is a memory, accessed with the address converted by the address setting unit 71, an address of which is written with the judgement signal indicating whether it is good or defective (good: "0", and defect: "1").

The semiconductor memory testing apparatus shown in FIG. 6 operates as follows.

In accordance with the operation control signals given from the central control unit 61, the pattern generator 62 makes the address generator 63, the data generator 64 and the control signal generator 65 generate the address pattern, the input data pattern and the expected value pattern, and the control signal pattern. The waveform shaping unit 66, upon receiving the address pattern, the input data pattern and the control signal pattern, selects each patterns among these patterns which corresponds to any one of the memory cell areas of the memory 68 under test, then shapes the waveform and input those in the form of an address signal, an input data signal and a control signal to the memory 68 under test. The memory 68 under test executes predetermined operations corresponding to those signals and outputs the output data signals. The judging unit 69 compares the output data signal from the memory 68 under test with the expected value pattern given from the pattern generator 62, then judges whether the memory 68 under test is well-conditioned or defective, and outputs a result thereof as a judgement signal. The judgement signal is supplied to the defect analyzing memory unit 60, at which time the address pattern supplied to the defect analyzing memory unit 60 from the pattern generator 62 is converted into the address of the defect analyzing memory 72 in accordance with the structure of the memory 68 under test, and the judgement signal is stored in this address of the defect analyzing memory 72.

There arise, however, the following problems inherent in the prior art semiconductor memory testing apparatus in the case of segmenting the defect analyzing memory into a plurality of regions, then storing these regions with a plurality of items of defect information on the memory under test and relieving the memory under test from the defect. Note that the defect analyzing memory is, it is herein assumed, segmented into the four regions and the defect information is stored in memory cell areas (A), (B), (C) and (D).

FIG. 9 is an explanatory diagram two-dimensionally illustrating how address spaces of the defect analyzing memory are allocated when storing the defect analyzing memory of the conventional semiconductor memory testing apparatus with the defect information. FIG. 10 is an explanatory diagram one-dimensionally illustrating how the address spaces of the defect analyzing memory are allocated when storing the defect analyzing memory of the conventional semiconductor memory testing apparatus with the defect information. All the regions of the defect analyzing memory are equally segmented into the four regions. These four regions are respectively formed with a memory cell defect (A) storage area 81, a memory defect (B) storage area 82, a memory defect (C) storage area 83 and a memory defect (D) storage area 84 stored with the defect information about the defective memory cells in the memory cell areas (A), (B), (C) and (D) in the memory under test.

A switching signal for controlling which regions to be accessed among the four equally-segmented regions of the defect analyzing memory, is a part of, e.g., the address signal, and hence it follows that any one of the four regions is selected by this signal. This signal for selecting any one of the four regions is most significant 2 bits o f, e.g., the address signal, and therefore the respective memory cell defect (A), (B), (C), (D) storage areas are formed in the four regions into which the whole defect analyzing memory is equally segmented by "4".

At this time, however, if there are not equalized capacities of the memory cell defect (A) storage area 81, the memory cell defect (B) storage area 82, the memory cell defect (C) storage area 83 and the memory cell defect (D) storage area 84 formed in the four regions into which the defect analyzing memory is segmented, the defect information is actually stored in only areas defined by the solid lines in FIGS. 9 and 10, which leads to a problem of causing a futility in the capacity of the defect analyzing memory.

For example, in the case that defect information of ordinary memory cells is stored in memory call defect (A) storage area 81, defect information of a row redundancy circuit is stored in memory cell defect (B) storage area 82, defect information of a column redundancy circuit is stored in memory cell defect (C) storage area 83 and defect information in a crossing part of the row and column redundancy circuits is stored in memory cell defect (D) storage area 84, when necessary storage capacity for the memory cell defect (A) storage area is assumed as 1, necessary storage capacities for the memory cell defect (B) and (C) storage areas 82 and 83 will usually be around 0.1 and the necessary storage capacity for the memory cell defect (D) will usually be around 0.01.

However, the address of each of the four segmented regions of the defect analyzing memory is structured of binary numbers, and it is required that the address space be increased double each time the address space is enlarged. Further, the address space needed for each region must be ensured corresponding to the address necessary for the region formed with the memory cell defect (A) storage area 81 having the largest capacity, and is therefore required as defined by the axis of abscissa and the axis of ordinates shown in FIG. 7. Accordingly, the regions formed with the memory cell defect (A) storage area 81, the memory cell defect (B) storage area (2, the memory cell defect (C) storage area 83 and the memory cell defect (D) storage area 84, are ensured in accordance with the address needed for the region formed with the memory cell defect (A) storage area 81 as described above. Therefore. as shown in FIG. 9, the area to be used in fact is only the area defined by the solid line, and the area defined by a dotted line drawn outwardly is an unused area. To express it one-dimensionally, as shown in FIG. 10, gap areas 80 unused for storing the defect information are formed, and is it can be recognized that there must be the futility in terms of the capacity of the defect analyzing memory.

Furthermore, the switching signal for controlling which region to be accessed among the four equally segmented regions of the defect analyzing memory be, it is required, generated as a part of the address signal. This switching signal has, however, no direct connection with a register calculation performed by the pattern generator in order to actually have an access to the memory cell of the memory under test. Therefore, even when trying to continuously test between the respective memory cells of the memory under test, the pattern generate needs to reset the address pattern during the test for each memory cell, resulting in such a problem that the continuous test is unable to be performed.

SUMMARY OF THE INVENTION

It is a primary object of the present invention, which was contrived to obviate the problems described above, to provide a semiconductor memory testing apparatus capable of effectively using a capacity of a defect analyzing memory and constructed so that efficiency of testing a test subject memory and of relieving the memory from a defect can be enhanced.

According to the present invention, there is provided an apparatus for testing a semiconductor memory device, comprising:

a signal generating unit for generating an input signal to a semiconductor memory device under test, an address signal for designating an address of a memory cell of said semiconductor memory device under test to which the input signal is supplied, an expected value signal for indicating an expected value of an output obtained when inputting the input signal to said memory cell of the address in said semiconductor memory device under test, and an address signal having an address space which is set based an classification of memory cells;

a judging unit for judging whether said memory cell of the address in said semiconductor memory device under test is good or defective by comparing the output signal outputted by said semiconductor memory device under test with the expected value signal in accordance with the input of the input signal to said memory cell of the above address, and generating a judgement signal about a result of the judgement; and a defect analyzing memory unit including a defect analyzing memory for storing the judgement signal in a predetermined address corresponding to an address space of said memory cell.

The semiconductor memory testing apparatus according to the present invention is characterized by such a point that an address for a signal applying address with respect to a memory under test and an address for storing a defect analyzing memory with defect information, are switched over as the necessity may arise according to a classification of memory cells of the memory under test. With this characteristic, the test for the memory under test can be efficiently performed, and it is feasible to efficiently relieve the memory under test from a defect by use of defect information on a redundant circuit of the memory under test.

BRIEF DESCRIPTION OF THE DRAWINGS

FIG. 2 is an explanatory diagram showing addresses when applying address signals to four memory call regions of a test subject memory;

FIG. 3 is an explanatory diagram showing storage address of four memory cell areas of a defect analyzing memory unit;

DESCRIPTION OF THE PREFERRED EMBODIMENTS

Embodiments of the semiconductor memory testing apparatus according to the present invention will hereinafter be discussed with reference to the accompanying drawings.

Figure 1:
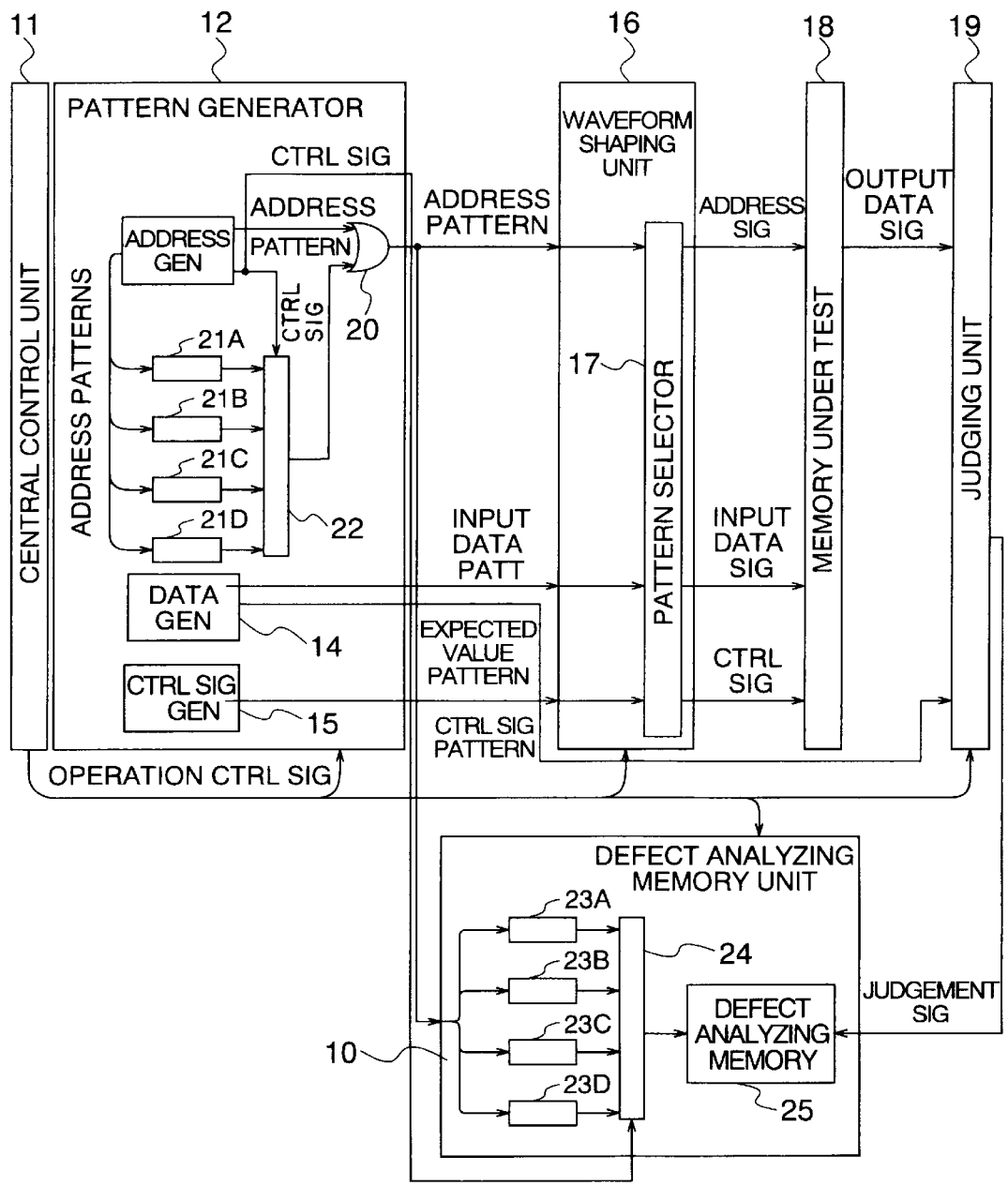
FIG. 1 is a block diagram showing a construction of a semiconductor memory testing apparatus according to the present invention.

FIG. 1 is a block diagram showing a construction of the semiconductor memory testing apparatus according to the present invention.

Referring to FIG. 1, the semiconductor memory testing apparatus is constructed of a central control unit 11 for controlling an operation of the whole apparatus, a pattern generator 12 for generating patterns of a variety of signals, a waveform shaping unit 16 for shaping waveforms in accordance with the patterns of the variety of signals which are received from the pattern generator 12 and inputting the variety of signals to a memory 18 under test, a judging unit 19 for judging whether the memory 18 under test is good or defective by comparing an output data signal from the memory 18 under test with an expected value pattern given from the pattern generator 12, and a defect analyzing memory unit 10 for receiving and storing a judgement signal given from the judging unit 19. The memory 18 under test is a semiconductor memory device as a subject to be tested.

Under control of a test program, the central control unit 11 controls the pattern generator 12, the waveform shaping unit 16, the judging unit 19 and the defect analyzing memory unit 10 in accordance with the operation control signal via a bus line. The central control unit 11 also processes defect data (good: "0", and defect: "1") in the defect analyzing memory unit 10, and writes data of "0"/"1" to the defect analyzing memory unit 10.

The pattern generator 12 includes an address generator 13 for generating an address pattern, a data generator 14 for generating an input data pattern with respect to the memory 18 tinder test and an expected value pattern with which the output data signal from the memory 18 under test is compared and contrasted, and a control signal generator 15 for generating a control signal pattern with respect to the memory 18 under test. The pattern generator 12 further includes address converting tables 21A, 21B, 21C, 21D stored with data of conversion address patterns indicating the memory call areas (A), (B), (C), (D) of the memory 18 under test, and an address converting table real-time witching unit 22 for selecting any one of the address converting tables 21A, 21B, 21C, 21D depending on which region to be accessed among the memory cell areas (A), (B), (C), (D) of the memory 18 under test. The address pattern of the table selected among the address converting tables 21A, 21B, 21C, 21D by the address converting table real-time switching unit 22, functions to convert the address pattern generated by the address generator 13, and the thus converted pattern is outputted as an address pattern from the pattern generator 12.

The waveform shaping unit 16 includes a pattern selector 17 for selecting any one of the patterns of the variety of signals serving the basis of the input signals to the memory 18 under test. The waveform shaping unit 16 shapes the waveforms in accordance with the patterns of the address signal, the input data signal and the control signal which are received from the pattern generator 12, and generates the input signals, i.e., the address signal, the input data signal and the control signal to the memory 18 under test.

The defect analyzing memory unit 10 includes address setting units 23A, 23B, 23C, 23D for converting into addresses when stored in a defect analyzing memory 25, address patterns (address patterns from the pattern generator 12) of addresses of memory cell areas that are test subjects in the memory 68 under test, in accordance with respective structures of the four memory cell areas in the memory 18 under test. The defect analyzing memory unit 10 also includes the address setting real-time switching unit 24 for selecting any one of the address setting units 23A, 23B, 23C, 23D depending on which regions to be accessed among the four memory cell areas, and the defect analyzing memory 25 for storing a judgement signal from the judging unit 19. The defect analyzing memory 25 is accessed based on the address pattern from one of the address setting units 23A, 23B, 23C, 23D which is selected by the address setting real-time switching unit 24.

The judging unit 19 compares the output data signal from the memory 18 under test with the expected value pattern from the pattern generator 12, and thereby judges whether the memory 18 under test is good or defective.

Each of the address setting units 23A, 23B, 23C, 23D of the defect analyzing memory unit 10 converts the address pattern of the address to be tested in the memory 18 under test into an address when storing the defect analyzing memory 25 with the judgement signal in accordance with the structure of the memory 18 under test. The detect analyzing memory 25 of the defect analyzing memory unit 10 is a memory, accessed with the address converted by each of the address setting units 23A, 23B, 23C, 23D, an address of which is written with the judgement signal indicating whether it is good or defective (good: "0", and defect: "1").

Given hereinafter is an explanation of how the address is set in the semiconductor memory testing apparatus according to the present invention.

FIG. 2 is an explanatory diagram showing the addresses when applying the address signals to the four memory cell areas of the memory 18 under test. The address is composed of address pattern data for controlling the switching of each memory cell, and address pattern data for having an access to each memory cell.

As shown in FIG. 2, the memory cell area (A) is accessed with Yj(0), Xi(0), YD-YC, XB-XA. The memory call area (B) is accessed with Yj(0), Xi(1), YD'-YC', XF-XE. The memory cell area (C) is accessed with Yj(1), Xi(0), YH-YG, XB'-XA'. The memory cell area (D) is accessed with Yj(1), Xi(1), YH-YG, XF-XE.

Necessary addresses for the above-mentioned areas are: for example, in the case of a memory cell necessitating 10 bit X address and 10 bit Y address, 6 bits for X address of the row redundancy circuit, 6 bits for Y address of the column redundancy circuit.

Thus, address spaces of the respective memory cell areas (A), (B), (C), (D) of the memory 18 under test are each independently set.

When the address is set, the converting address pattern for the memory cell area (A) is retained in the address converting table 21A, the converting address pattern for the memory cell area (B) is retained in the address converting table 21B, the converting address pattern for the memory cell area (C) is retained in the address converting table 21C, and the converting address pattern for the memory cell area (D) is retained in the address converting table 21D, respectively.

FIG. 3 is an explanatory diagram showing storage addresses of the four memory cell areas of the defect analyzing memory unit 10.

As shown in FIG. 3, the storage addresses of the four memory cell areas of the defect analyzing memory unit 10 are set corresponding to the addresses when applying the address signals to the four memory cell areas of the memory 18 under test illustrated in FIG. 2. That is, the addresses of the memory cell areas (A), (B), (C), (D) of the memory under test are each independently set so that the memory cell area (A) is accessed with YD-YC, XB-XA, the memory cell area (B) is accessed with YD'-YC', XF-XE, the memory cell area (C) is accessed with YH-YG, XB'-XA', and the memory cell area (D) is accessed with YH-YG, XF-XE. Further, the addresses of the memory cell areas (A), (B), (C), (D) are set so that the first address of the memory cell area (B) becomes an address immediately posterior to the last address of the memory cell area (A), the first address of the memory cell area (C) becomes an address immediately posterior to the last address of the memory cell area (B), the first address of the memory cell area (D) becomes an address immediately posterior to the last address of the memory cell area (C). Capacities of the respective memory cell areas (A), (B), (C), (D) of the memory under test are each examined beforehand.

For example, when addresses applied to the memory under test are generated as shown in FIG. 2, capacities of the detect analyzing memory are effectively utilized by setting addresses of the defect analyzing memory as shown in FIG. 3.

As discussed above, the address spaces of the memory cell areas (A), (B), (C), (D) of the memory under test are each independently set, and, besides, the address spaces needed for setting the addresses of the memory cell areas are made continuous, whereby the capacity of the defect analyzing memory can be effectively utilized.

The semiconductor memory testing apparatus according to the present invention operates in the way which follows.

In response to an operation control signal from the central control unit 11, the address generator 13 of the pattern generator 12 generates a control signal serving as a basis of the address pattern, the data generator 14 generates an input data pattern and an expected value pattern, and the control signal generator 15 generates a control signal pattern, respectively. Herein, the control signal generated by the address generator 13 is supplied to the address converting table real-time switching unit 22, an address synthesizer 20, and the address setting real-time switching unit 24. The address converting table real-time switching unit 22 selects any one of the address converting tables 21A, 21B, 21C, 21D in accordance with a signal indicating the memory cell area, which is contained in the control signal. The selected address converting table functions to convert the address pattern into the address set with respect to the memory cell area which is contained in the control signal. And output the converted address to the address synthesizer 20. The address synthesizer 20 synthesizes the address pattern from the address generator 13 with a pattern of the address converted by the address converting table, and outputs a result of the synthesization as an address pattern.

The waveform shaping unit 16, upon receiving the address pattern, the input data pattern and the control signal pattern, selects one of these patterns with respect to any one of the memory cell areas of the memory is 18 under test by use of the pattern selector 17, then shapes the waveform thereof, and input it as one of an address signal, an input data signal and a control signal to the memory 18 under test.

The memory 18 under test executes a predetermined operation corresponding to the signal and outputs an output data signal. The judging unit 19 compares the output data signal from the memory 18 under test with the expected value pattern from the pattern generator 12, thus judges whether the memory 18 under test is god or defective, and outputs a result of the judgement as a judgement signal.

The judgement signal is supplied to the defect analyzing memory unit 10. The address setting real-time switching unit 24 receiving the control signal supplied to the defect analyzing memory unit 10 from the pattern generator 12 at this time, selects, in accordance with which region the access has been given to among the memory cell areas of the memory 18 under test, any one of the address setting units 23A, 22B, 23C, 23D which corresponds to that accessed memory cell area. The selected address setting unit converts the address pattern from the pattern generator 12 into an address of the defect analyzing memory 25 which is set in accordance with the structure of the memory 18 under test, and the judgement signal is stored in that address of the defect analyzing memory 25.

Figure 4:
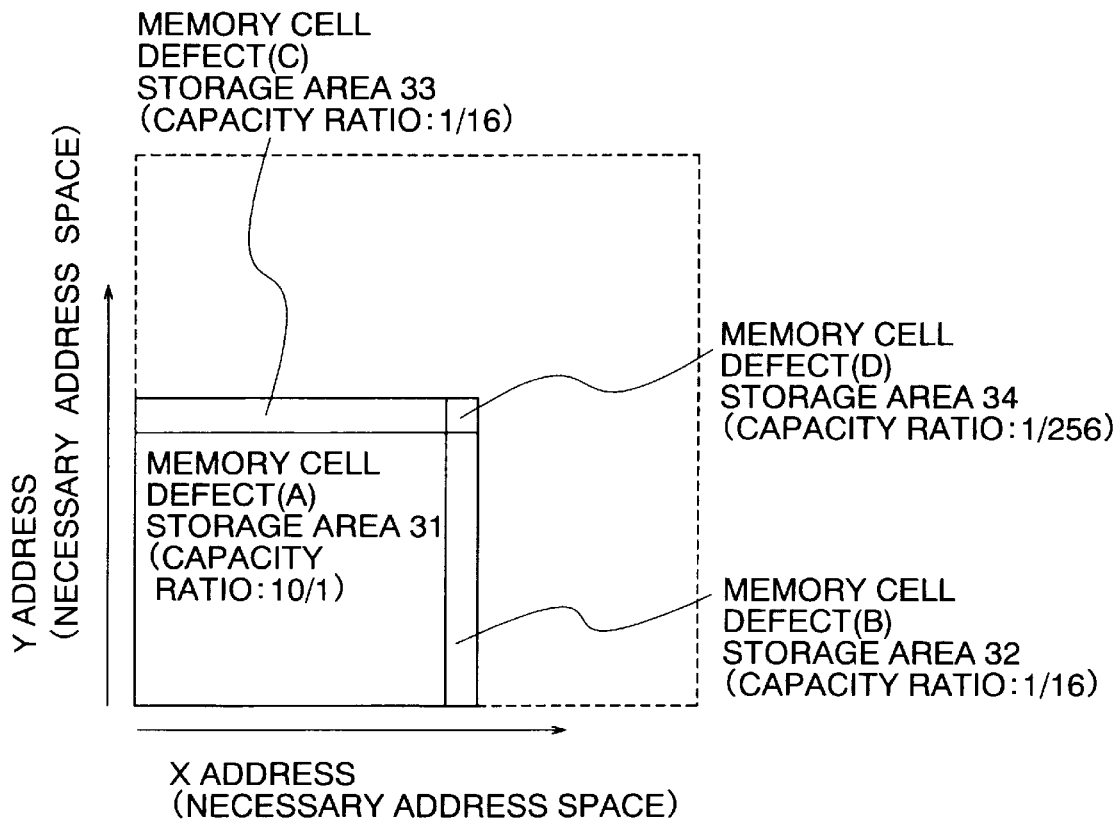
FIG. 4 is an explanatory diagram two-dimensionally showing how address spaces of the defect analyzing memory are allocated when storing the defect analyzing memory of the semiconductor memory testing apparatus of the present invention with defect information.
Figure 5:
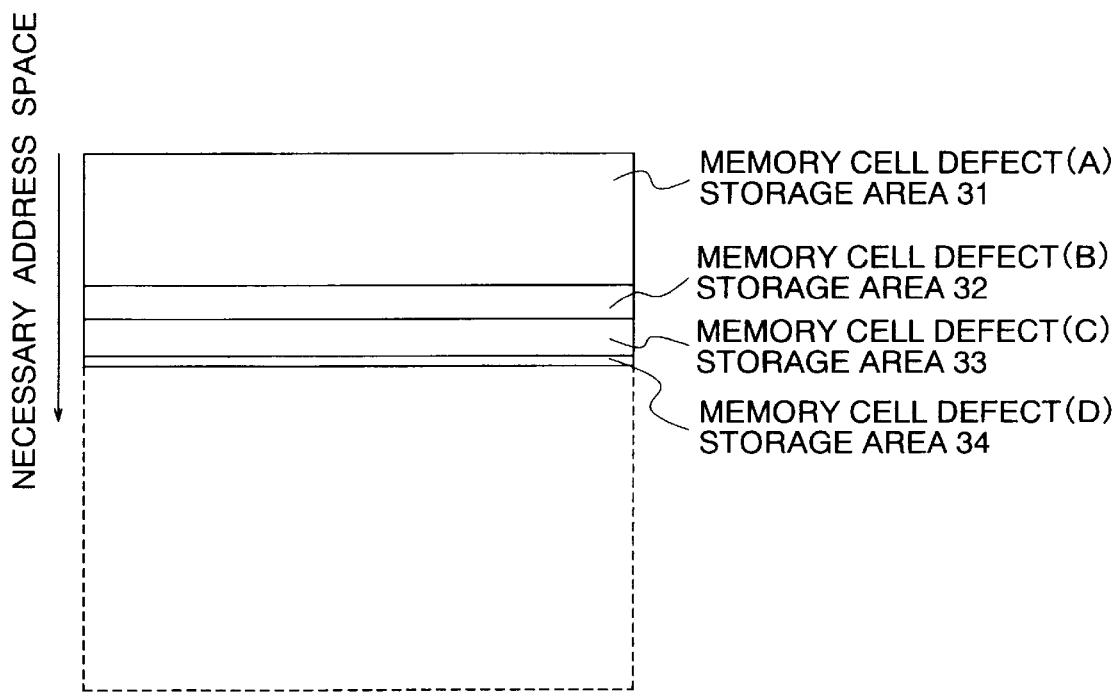
FIG. 5 is an explanatory diagram one-dimensionally showing how the address spaces of the defect analyzing memory are allocated when storing the defect analyzing memory of the semiconductor memory testing apparatus of the present invention with defect information.

FIG. 4 is an explanatory diagram two-dimensionally showing how the address spaces of the defect analyzing memory are allocated when storing the defect analyzing memory of the semiconductor memory testing apparatus of the present invention with the defect information. FIG. 5 is an explanatory diagram one-dimensionally showing how the address spaces of the defect analyzing memory are allocated when storing the defect analyzing memory of the semiconductor memory testing apparatus of the present invention with the defect information.

For example, when address allocation for defect analyzing memory is set as shown in FIG. 3, necessary memory capacitor for the defect analyzing memory is $(1+1/16+1/16+1/256)=1.13$ time of the cell defect storage area for the ordinary memory cells as shown by solid lines in FIG. 4, whereas in the conventional defect analyzing memory, four times of memory capacity has bean necessary as shown in broken line in FIG. 4.

Figure 6:
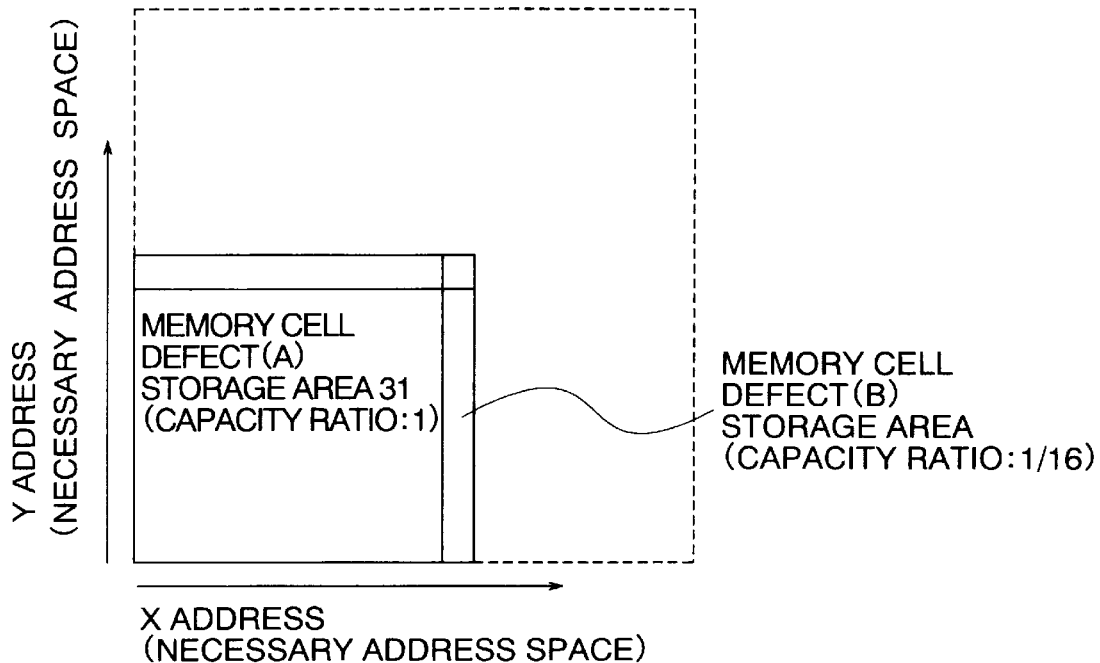
FIG. 6 is an explanatory diagram showing other example of allocation of address spaces of the defect analyzing memory of the semiconductor memory testing apparatus.

FIG. 6 is an explanatory diagram showing other example of allocation of address spaces of the defect analyzing memory of the semiconductor memory testing apparatus. In this figure, it is assumed that the memory under test has only an ordinary memory cell and a redundancy circuit for rows.

In this case, as shown in FIG. 6, only the memory cell detect (B) storage area having a size of $\frac{1}{16}$ is provided neighboring to the ordinary memory cell defect (A) storage area, necessary memory capacity will be decreased compared to the conventional technique.

Figure 7:
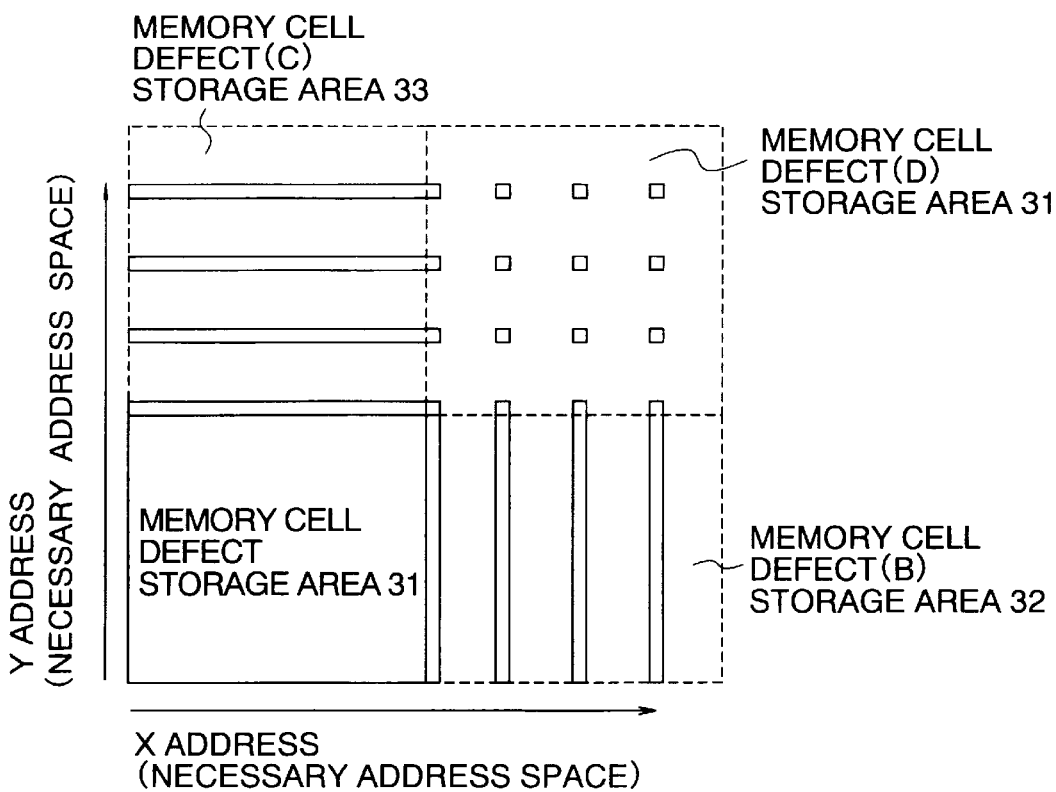
FIG. 7 is an explanatory diagram showing further example of allocation of address spaces of the defect analyzing memory of the semiconductor memory testing apparatus.

FIG. 7 is an explanatory diagram showing further example of allocation of address spaces of the defect analyzing memory of the semiconductor memory testing apparatus.

In the conventional technique, when defect information for row redundancy circuit, column redundancy circuit and their crossing portion is allocated by the same manner for the addressing of defect information for ordinary memory cell area, addresses are dispersed as shown in FIG. 7.

In this case, if address allocations of defect information for row redundancy circuit, column redundancy circuit and their crossing portion are performed independently, the dispersed address space becomes continuous address space.

Figure 8:
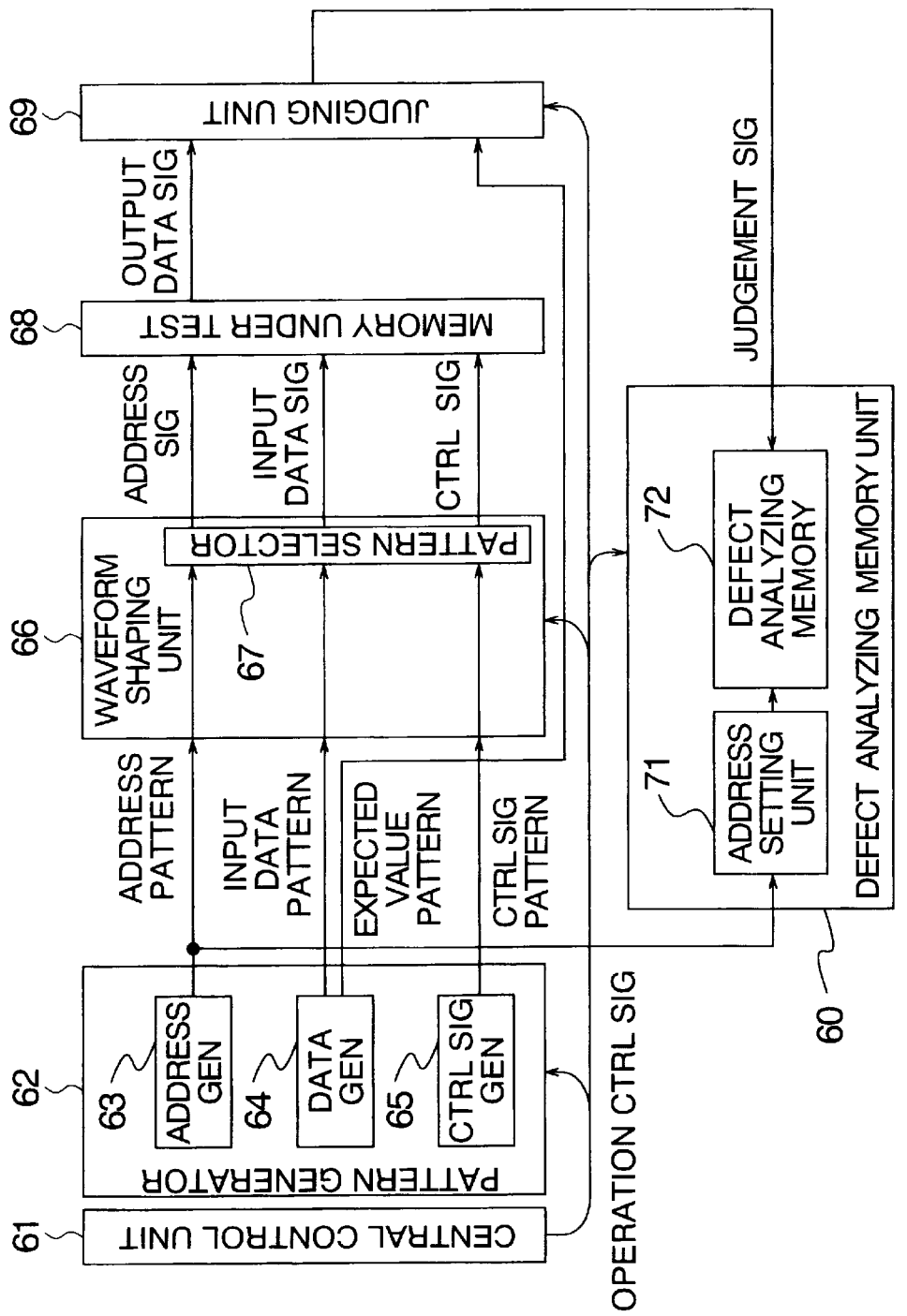
FIG. 8 is a block diagram illustrating a construction of a prior art semiconductor memory testing apparatus.
Figure 9:
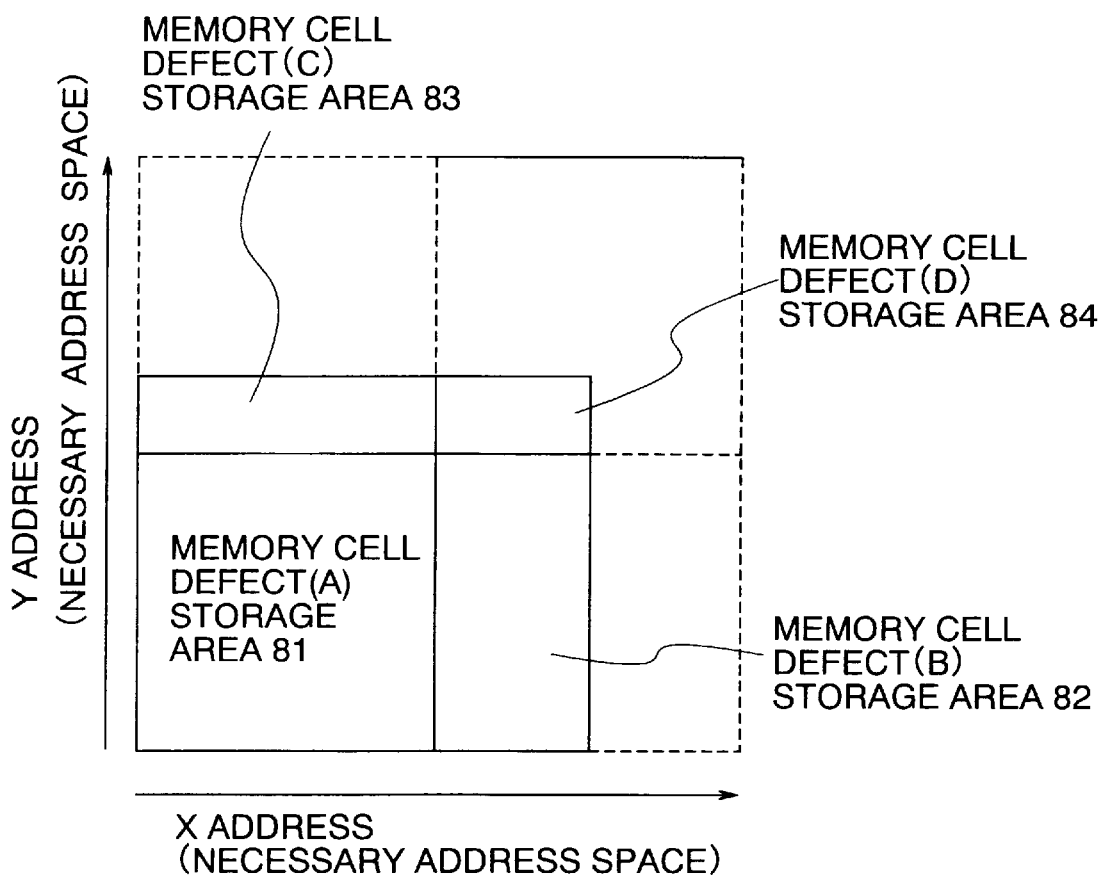
FIG. 9 is an explanatory diagram two-dimensionally showing how address spaces of a defect analyzing memory are allocated when storing a defect analyzing memory of the prior art semiconductor memory testing apparatus with defect information.
Figure 10:
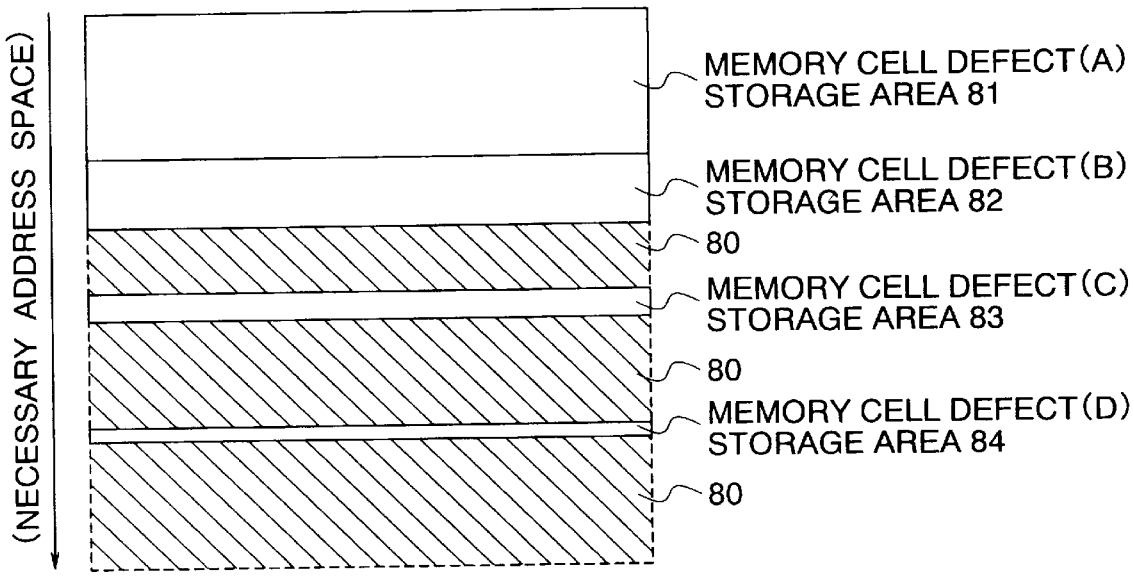
FIG. 10 is an explanatory diagram one-dimensionally showing how the address spaces of the defect analyzing memory are allocated when storing the defect analyzing memory of the prior art semiconductor memory testing apparatus with the defect information.

In the semiconductor memory testing apparatus according to the present invention, if the defect analyzing memory be, it is required, segmented into the plurality of regions which are then stored with the defect information about the memory under test, the address for accessing to the defect analyzing memory can be set per memory cell area of the memory under test. As a result, as shown in FIGS. 4 and 5, the defect information is stored, and the address spaces required are made continuous and can be restrained down to the minimum. Namely, the addresses of the regions stored with the defect information on the respective memory cell areas can be independently set, and hence the capacity of the defect analyzing memory can be used at a high efficiency, with the result that the gap areas 80 drawn by the oblique lines in FIGS. 7 and 8 may be eliminated.

Further, in the pattern generator 12, the address pattern can be independently set per memory cell area. Moreover, the regions of the defect analyzing memory for storing the defect information on the memory cell areas can be switched over as the occasion may demand.

As a consequence, the testing between the memory cells of the memory under test can be conducted irrespective of the relationship in terms of the addresses between the memory cells.

According to the semiconductor memory testing apparatus of the present invention, the address spaces of the address signals generated by the signal generating unit can be set corresponding to the classification of the memory cells, and, besides, the signal generating unit includes the address space switching unit for switching over the address spaces at any times. Further, the defect analyzing memory unit is constructed to set the predetermined address corresponding to the address space to which the address signal belongs, and it is therefore feasible to effectively utilize the capacity of the defect analyzing memory by restraining the required address spaces down to the minimum and switching over the defect analyzing memory regions for storing the defect information about the respective memory cell areas as the necessity may arise. Furthermore, the address signals can be independently set corresponding to the memory cell areas, and hence it is possible to consecutively perform the test between the memory cells of the memory under test regardless of the relationship in the addresses between the memory cells.

The address spaces set according to the classification of the memory cells of the semiconductor device to be tested, are set mutually independently, and it is therefore feasible to effectively utilize the capacity of the defect analyzing memory by restraining the required address spaces down to the minimum and switching over the defect analyzing memory regions stored with the defect information on the memory cell areas as the occasion may demand.

An aggregation of the predetermined addresses set corresponding to the address spaces are those formed with the continuous address spaces, and hence the capacity of the defect analyzing memory can be effectively utilized by restraining the required address spaces down to the minimum and switching over the defect analyzing memory regions for storing the defect information about the memory cell areas at any times.

What is claimed is:

1. An apparatus for testing a semiconductor memory device, comprising:

a signal generating unit for generating an input signal to a semiconductor memory device under test, an address signal for designating an address of a memory cell of said semiconductor memory device under test to which the input signal is supplied, an expected value signal for indicating an expected value of an output obtained when inputting the input signal to said memory cell of the address in said semiconductor memory device under test, and an address signal having an address space which is set based on according to classification of memory cells;

a judging unit for judging whether said memory cell of the address in said semiconductor memory device under test is good or defective by comparing the output signal outputted by said semiconductor memory device under test with the expected value signal in accordance with the input of the input signal to said memory cell of the above address, and generating a judgement signal about a result of the judgement; and a defect analyzing memory unit including a defect analyzing memory for storing the judgement signal in a predetermined address corresponding to an address space of said memory cell.

2. The apparatus for testing a semiconductor memory device according to claim 1, wherein said signal generating unit includes a first address space switch for switching over the address space of a address signal generated therefrom, and said defect analyzing memory unit includes a second address space switch for switching over the address space of the defect analyzing memory in response to the address space of the address signal.

3. The apparatus for testing a semiconductor memory device according to claim 1, wherein said address spaces set according to classification of memory cells are independently set.

4. The apparatus for testing a semiconductor memory device according to claim 1, wherein a set of said predetermined address corresponding to the address space of said memory cell form a continuous address space derived from a dispersed address space.

5. An apparatus for testing a semiconductor memory device, comprising:

a signal generating unit for generating an input signal to a semiconductor memory device under test, an address signal for designating an address of a memory cell of said semiconductor memory device under test to which the input signal is supplied, an expected value signal for indicating an expected value of an output obtained when inputting the input signal to said memory cell of the address in said semiconductor memory device under test, and an address signal having an address space which is set based on according to classification of memory cells;

a judging unit for judging whether said memory cell of the address in said semiconductor memory device under test is good or defective by comparing the output signal outputted by said semiconductor memory device under test with the expected value signal in accordance with the input of the input signal to said memory cell of the above address, and generating a judgement signal about a result of the judgement; and a defect analyzing memory unit including a defect analyzing memory for storing the judgement signal in a predetermined address corresponding to an address space of said memory cell;

said signal generating unit includes a first address space switch for switching over the address space of an address signal generated therefrom, and said defect analyzing memory unit includes a second address space switch for switching over the address space of the defect analyzing memory in response to the address space of the address signal; and said signal generating unit includes a plurality of address conversion tables provided for the classification of memory cells and an address conversion table switch as the first address space switch.

6. An apparatus for testing a semiconductor memory device, comprising:

a signal generating unit for generating an input signal to a semiconductor memory device under test, an address signal for designating an address of a memory cell of said semiconductor memory device under test to which the input signal is supplied, an expected value signal for indicating an expected value of an output obtained when inputting the input signal to said memory cell of the address in said semiconductor memory device under test, and an address signal having an address space which is set based on according to classification of memory cells;

a judging unit for judging whether said memory cell of the address in said semiconductor memory device under test is good or defective by comparing the output signal outputted by said semiconductor memory device under test with the expected value signal in accordance with the input of the input signal to said memory cell of the above address, and generating a judgement signal about a result of the judgement; and a defect analyzing memory unit including a defect analyzing memory for storing the judgement signal in a predetermined address corresponding to an address space of said memory cell;

said address space set according to classification of memory cells is set for two or more based on the classification of memory cells; and the memory device under test has redundancy circuits for a row and a column, said defect analyzing memory unit sets address spaces for the row and a column.

7. The apparatus for testing a semiconductor memory device according to claim 6, wherein if the memory device under test has redundancy circuits for a row, said defect analyzing memory unit sets address spaces for the row.

* * * * *